United States Patent
Ohno

(12) United States Patent (10) Patent No.: US 7,009,221 B2
(45) Date of Patent: Mar. 7, 2006

(54) LIGHT-EMITTING THYRISTOR AND SELF-SCANNING LIGHT-EMITTING DEVICE

(75) Inventor: Seiji Ohno, Osaka (JP)

(73) Assignee: Nippon Sheet Glass Company Limited, Tokyo (JP)

( * ) Notice: Subject to any disclaimer, the term of this patent is extended or adjusted under 35 U.S.C. 154(b) by 0 days.

(21) Appl. No.: 10/831,000

(22) Filed: Apr. 23, 2004

(65) Prior Publication Data

US 2004/0196708 A1  Oct. 7, 2004

Related U.S. Application Data

(62) Division of application No. 09/830,036, filed on Apr. 19, 2001, now Pat. No. 6,825,500.

(30) Foreign Application Priority Data

Aug. 23, 1999 (JP) ................. 11-234881
Aug. 23, 1999 (JP) ................. 11-234884
Aug. 25, 1999 (JP) ................. 11-238110

(51) Int. Cl.
*H01L 29/32* (2006.01)
(52) U.S. Cl. ...................... 257/107; 257/102
(58) Field of Classification Search .............. 257/107, 257/116, 79, 102, 103
See application file for complete search history.

(56) References Cited

U.S. PATENT DOCUMENTS

| | | | |
|---|---|---|---|
| 4,920,062 A * | 4/1990 | Tsunoda | 438/137 |
| 5,461,243 A | 10/1995 | Ek et al. | |
| 5,751,753 A | 5/1998 | Uchida | |
| 5,814,841 A | 9/1998 | Kusuda et al. | |
| 6,590,347 B1 * | 7/2003 | Ohno et al. | 315/169.3 |
| 6,614,055 B1 * | 9/2003 | Kusuda et al. | 257/79 |

FOREIGN PATENT DOCUMENTS

| | | |
|---|---|---|
| JP | 60-028291 A | 2/1985 |
| JP | 1-186684 A | 7/1989 |
| JP | 1-212483 A | 8/1989 |
| JP | 6-252443 A | 9/1994 |
| JP | 8-088444 A | 4/1996 |
| JP | 9-213995 A | 8/1997 |
| JP | 9-283793 A | 10/1997 |
| JP | 9-283794 A | 10/1997 |
| JP | 10-28756 A | 10/1998 |

* cited by examiner

*Primary Examiner*—Sara Crane
(74) *Attorney, Agent, or Firm*—RatnerPrestia

(57) ABSTRACT

A light-emitting thyristor having an improved luminous efficiency is provided. According to the light-emitting thyristor, a p-type AlGaAs layer and an n-type AlGaAs layer are alternately stacked to form a pnpn structure on a GaAs buffer layer formed on a GaAs substrate, and Al composition of the AlGaAs layer just above the GaAs buffer layer is increased in steps or continuously.

8 Claims, 18 Drawing Sheets

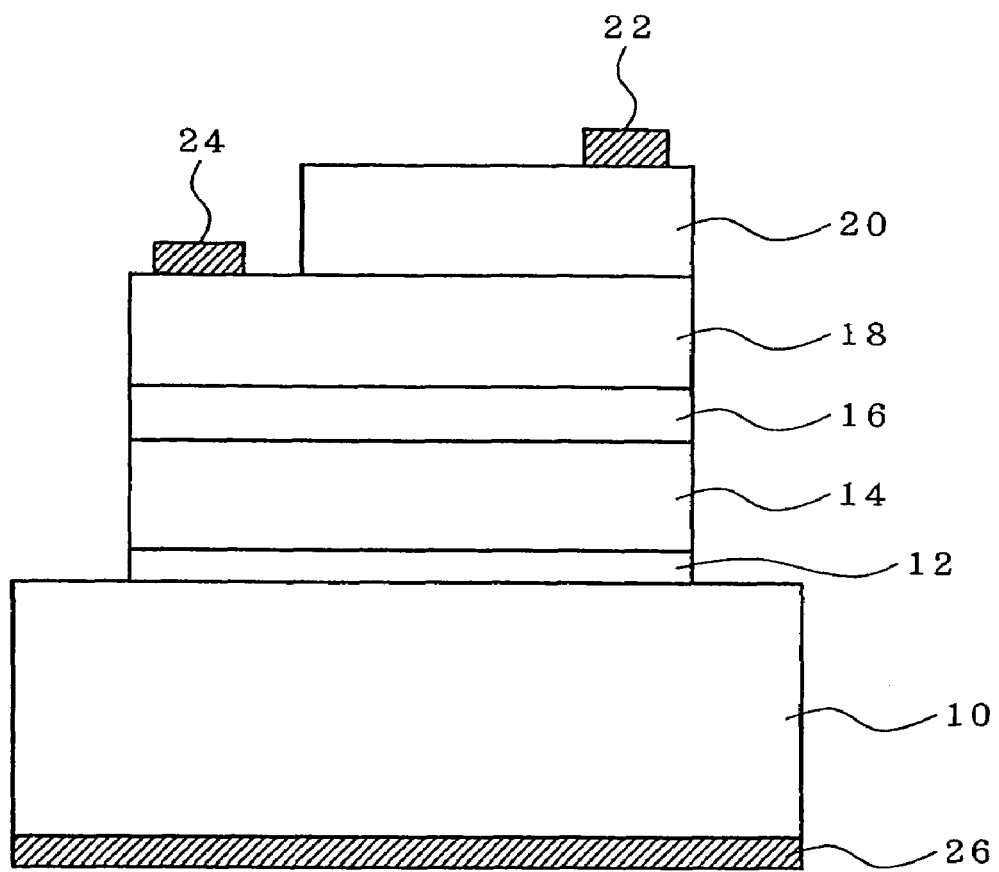
F I G. 1

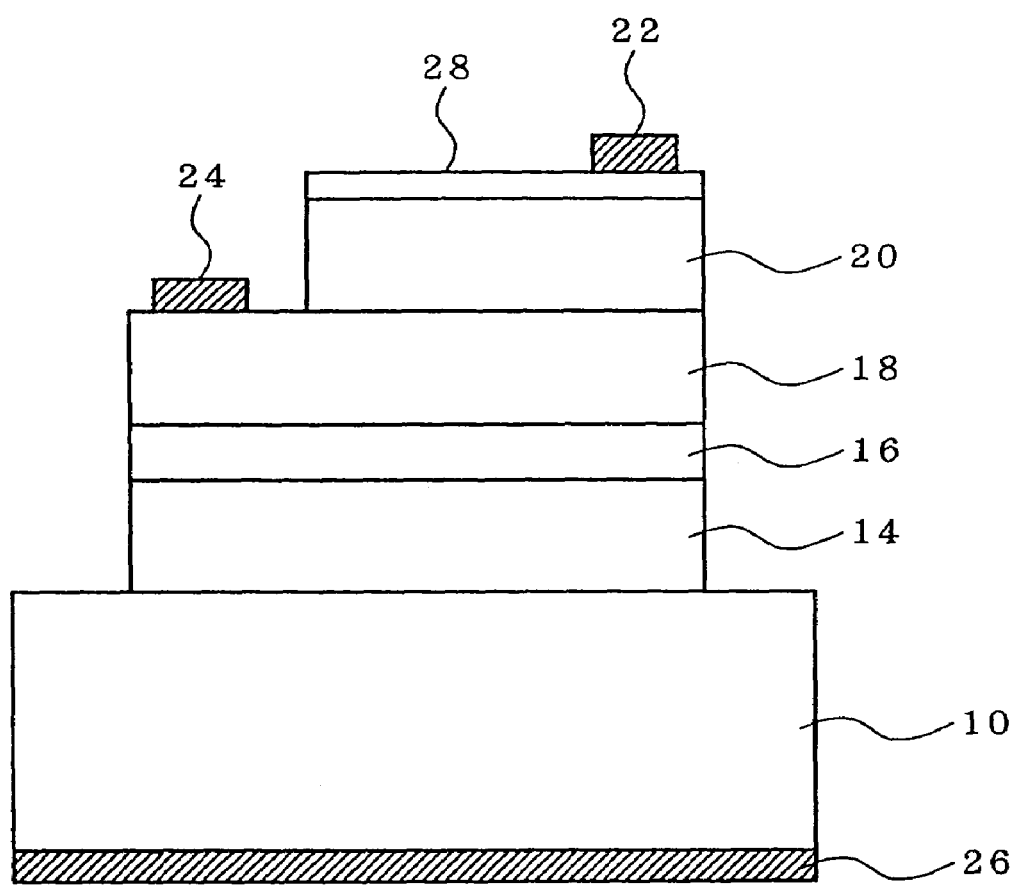
F I G. 2

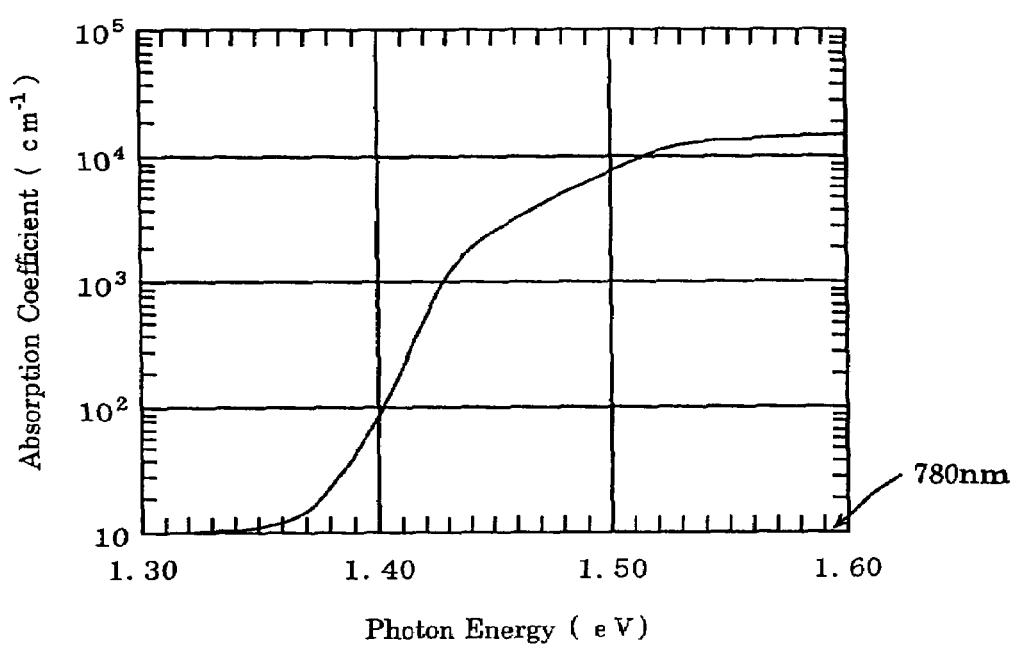
F I G. 3

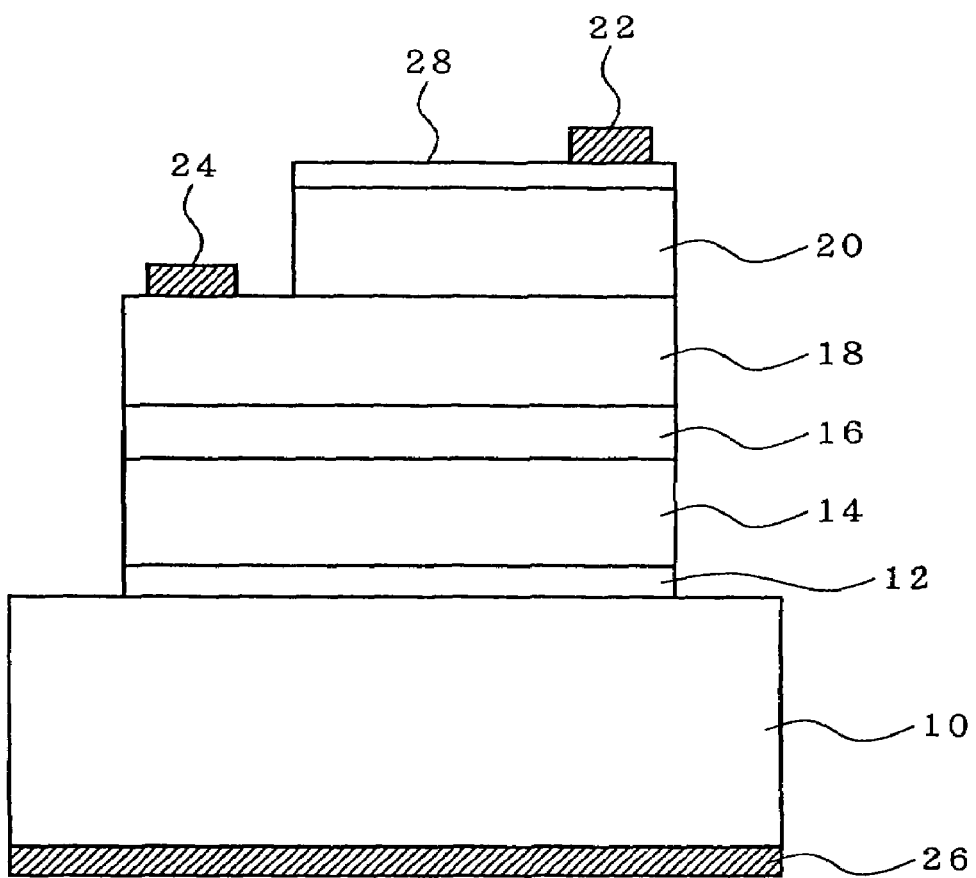
F I G. 4

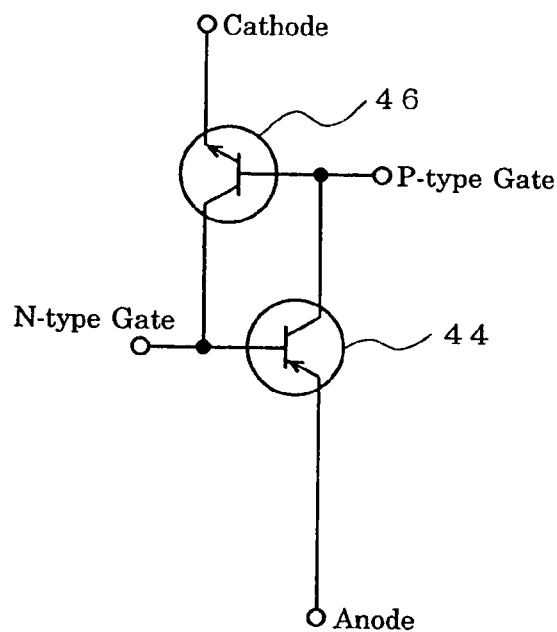
F I G. 5
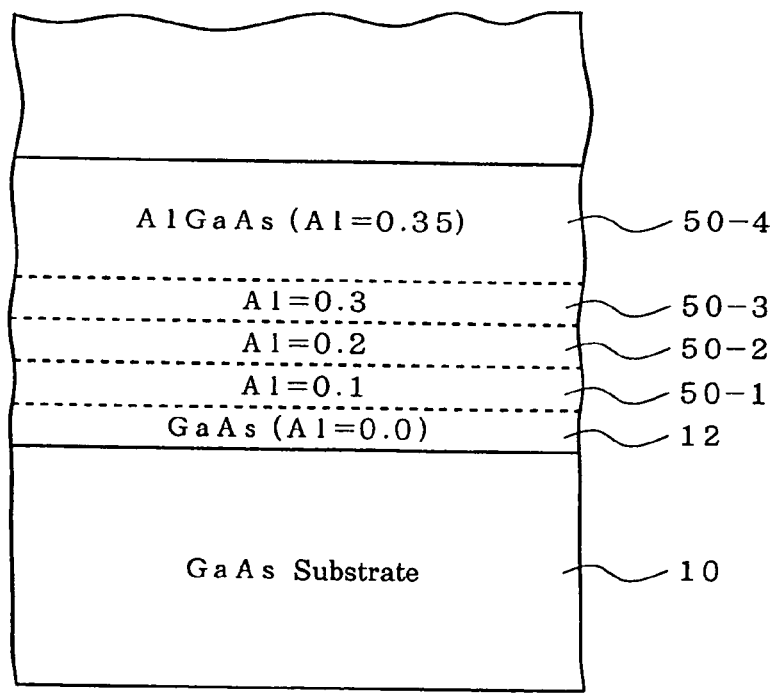
F I G. 6

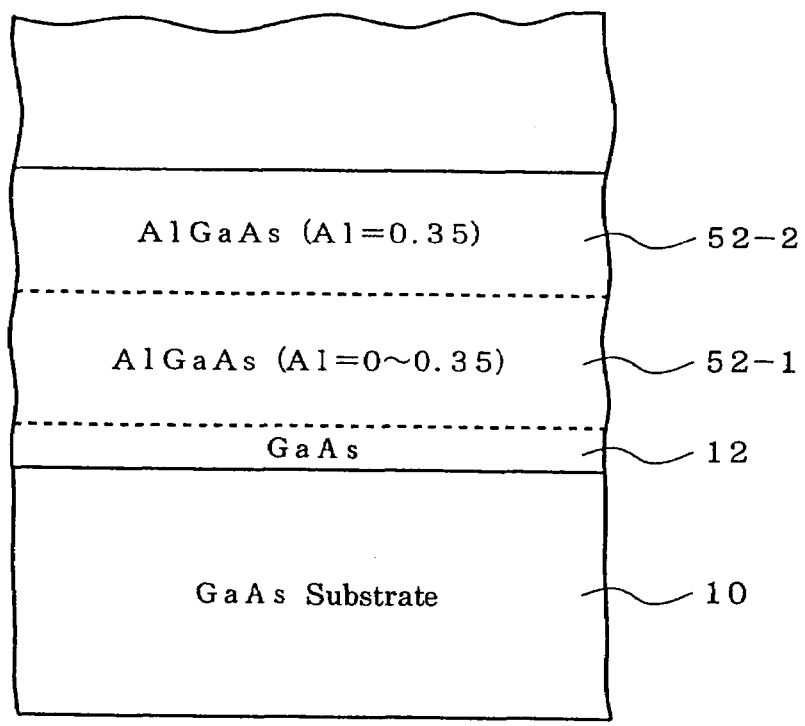
F I G. 7
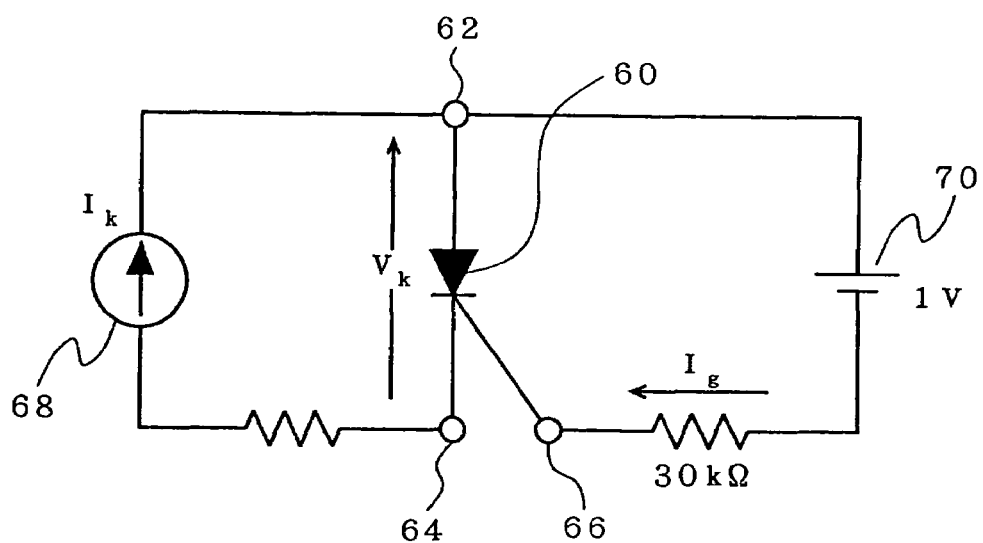
F I G. 8

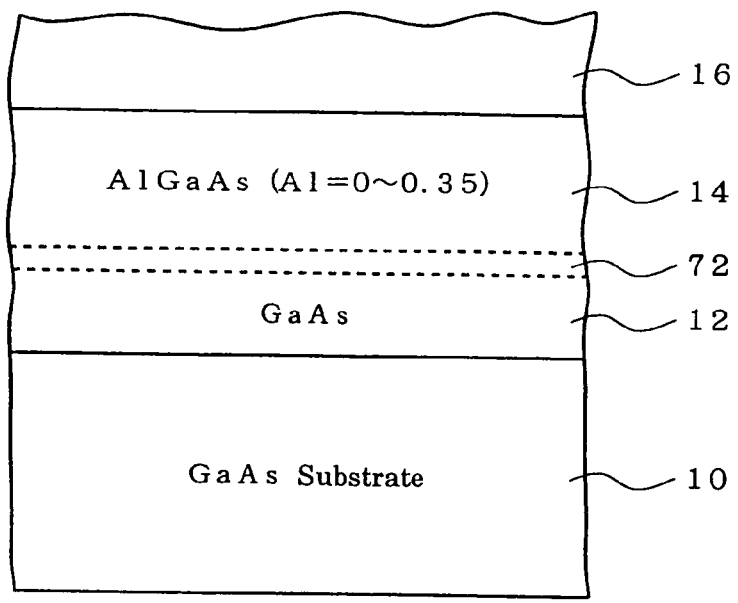
F I G. 1 1
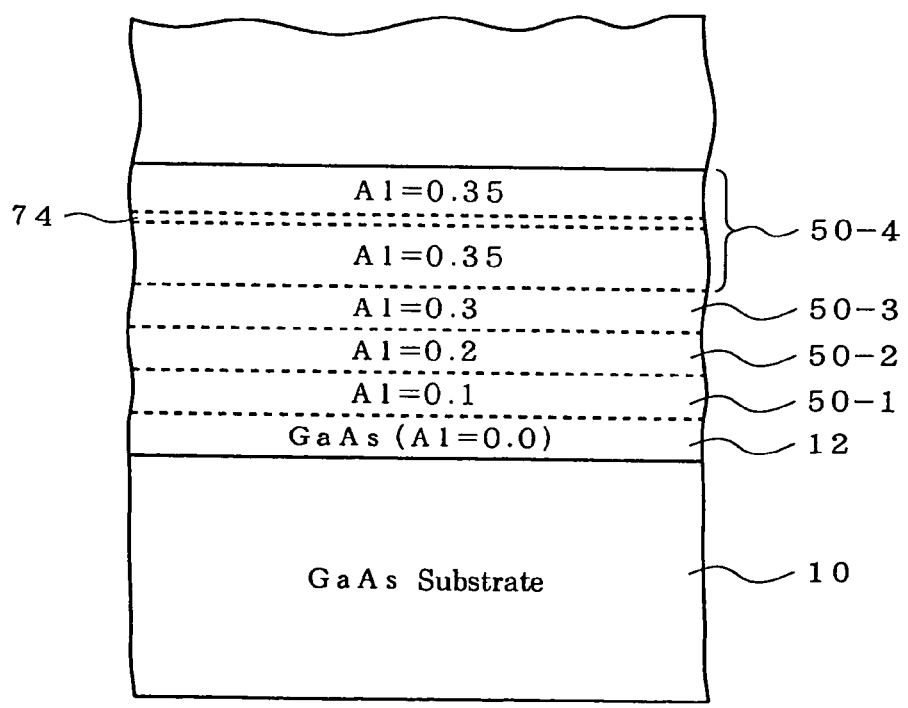
F I G. 1 2

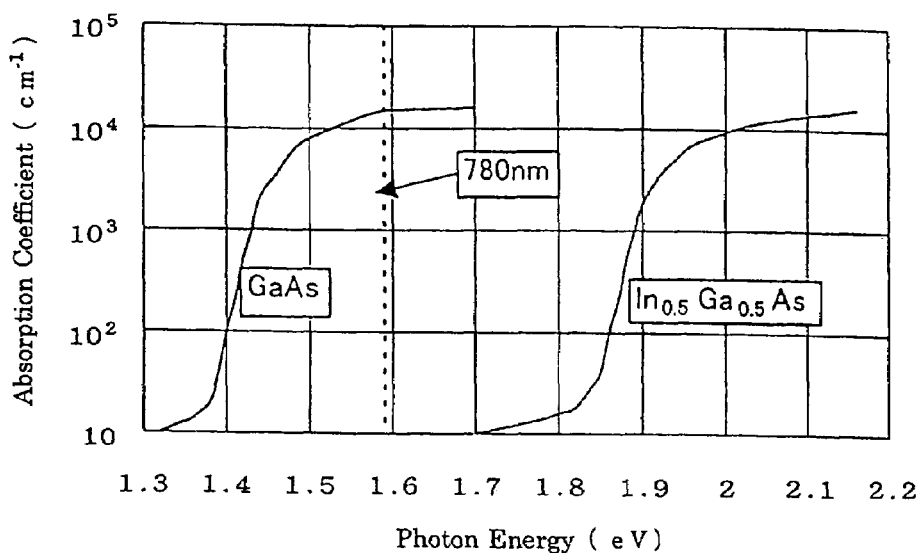
F I G. 1 6
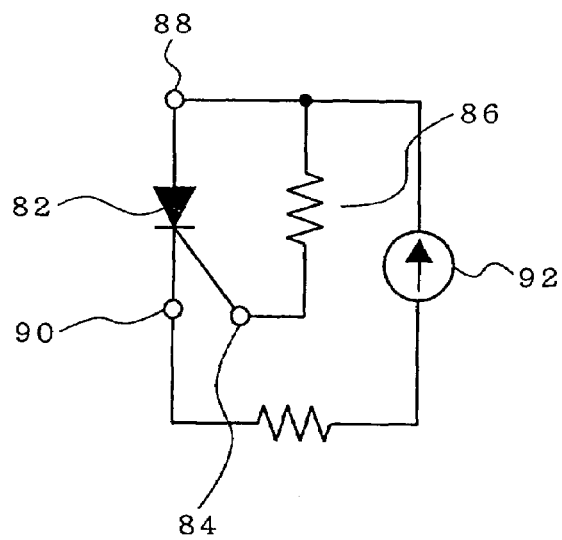
F I G. 1 7

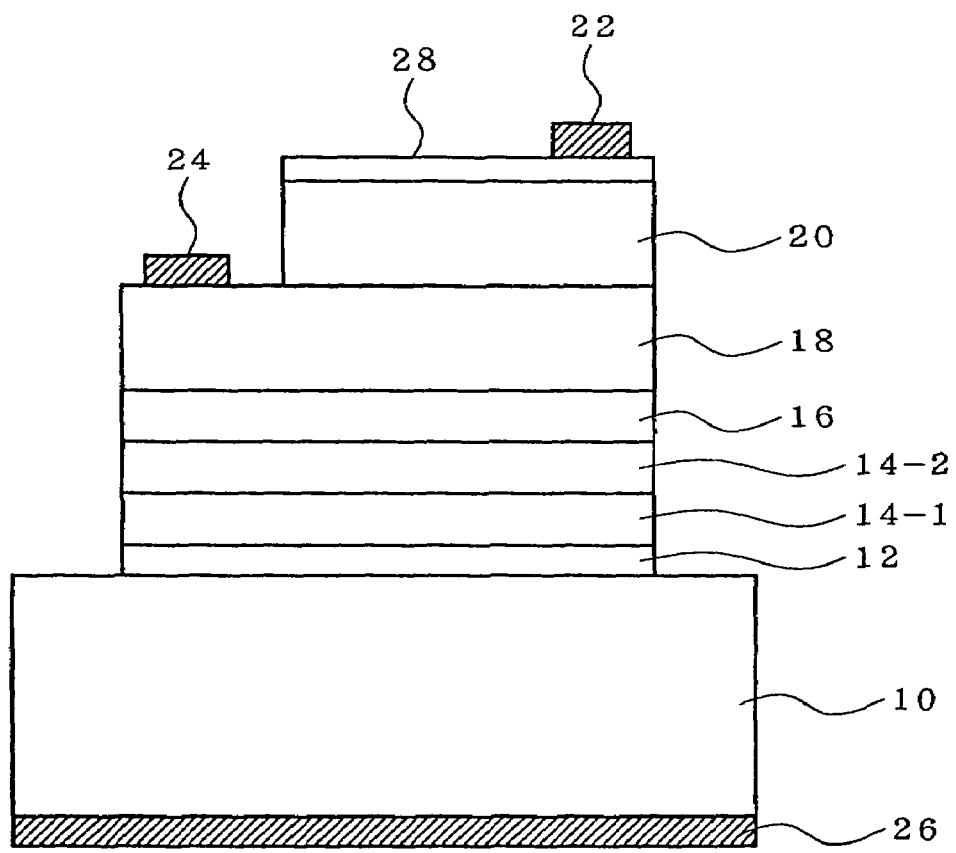
F I G. 2 1

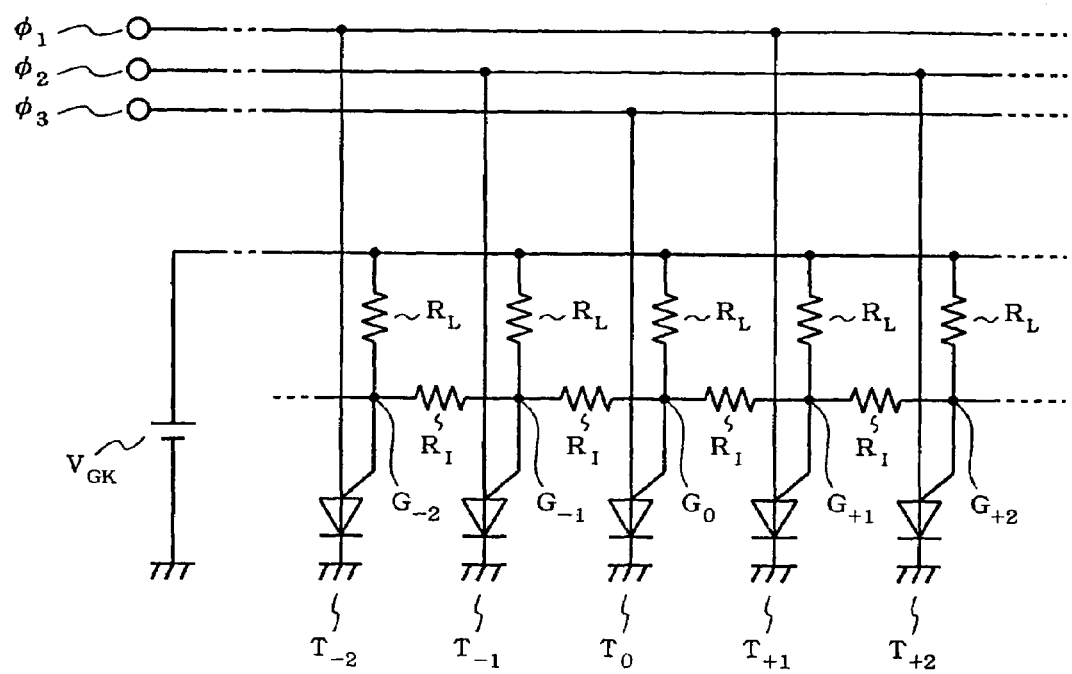
F I G. 2 2

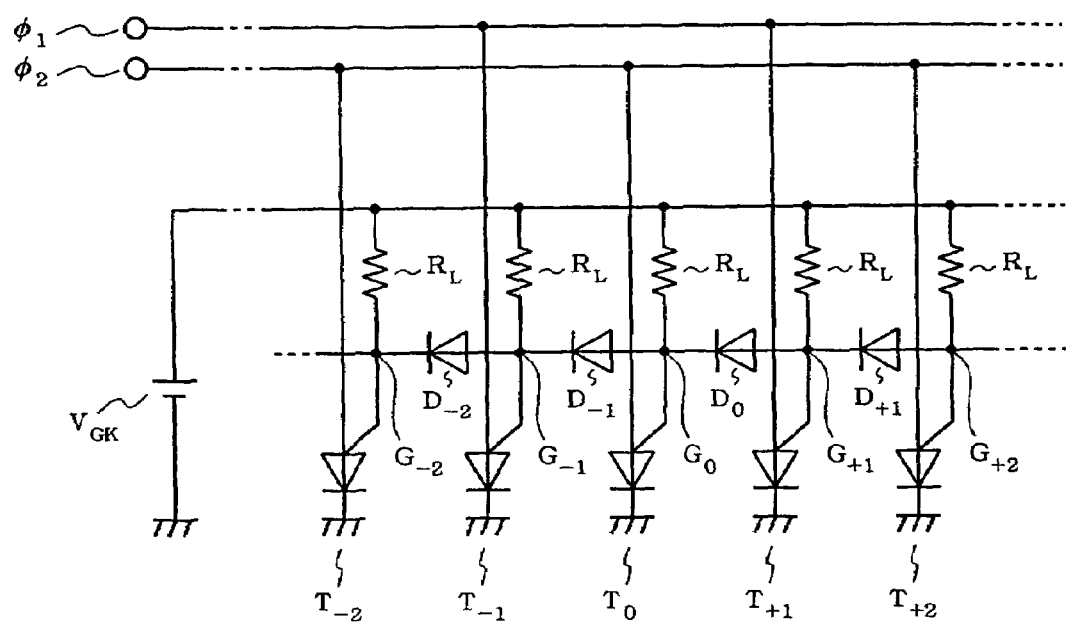
F I G. 2 3

LIGHT-EMITTING THYRISTOR AND SELF-SCANNING LIGHT-EMITTING DEVICE

This application is a divisional of U.S. patent application Ser. No. 09/830,036, filed Apr. 19, 2001 now U.S. Pat. No. 6,825,500.

TECHNICAL FIELD

The present invention relates to a light-emitting thyristor whose luminous efficiency is improved and a self-scanning light-emitting device using such light-emitting thyristors.

BACKGROUND ART

A surface light-emitting thyristors has been disclosed in the Japanese Patent Publication No. 2-14584, and an end-surface light-emitting thyristor in the Japanese Patent Publication No. 9-85985. The fundamental structure of a surface light-emitting are substantially the same, and AlGaAs (Al composition is 0.35, for example) layers are epitaxially grown on a GaAs buffer layer formed on a GaAs substrate, for example.

FIG. 1 is a schematic cross-sectional view depicting a fundamental structure of a light-emitting thyristor. As shown in FIG. 1, on a p-type GaAs substrate 10 successively stacked are a p-type GaAs buffer layer 12, a p-type AlGaAs layer 14, an n-type AlGaAs layer 16, a p-type AlGaAs layer 18, and an n-type AlGaAs layer 20. On the AlGaAs layer 20 provided is a cathode electode 22, and on the AlGaAs layer 18 a gate electrode 24. An anode electrode 26 is provided on the bottom surface of the GaAs substrate 10.

In this example, a p-type layer, an n-type layer, a p-type layer, and an n-type layer are stacked in this order on a p-type GaAs substrate via a buffer layer. However, an n-type layer, an p-type layer, an n-type layer, and a p-type layer may be stacked in this order on an n-type GaAs substrate via a buffer layer, in this case the uppermost electrode is an anode one, and the bottommost electrode is a cathode one.

In the above-described publications, the inventors of this application have already disclosed a self-scanning light-emitting device structured by arranging such light-emitting thyristors in an array, a self-scanning function thereof being implemented by providing a suitable interaction between neighbored thyristors in the array. The publications have further disclosed that such self-scanning light-emitting device has a simple and compact structure for a light source of a printer, and has smaller arranging pitch of thyristors in the array.

In the light-emitting thyristor having such structure described-above, Al composition is largely varied, for example from 0 to 0.35, at the interface between the GaAs buffer layer and the AlGaAs layer on the buffer layer. Such rapid variation of Al composition causes the turbulence of lattices or the large variation of energy bands at the interface, while the variation of lattice constants is small. As a result, a lattice-mismatching at the interface become large, thereby causing a dislocation. Also, an energy gap at the interface is increased, so that the deformation of energy bands is made large.

Therefore, for the light-emitting thyristor fabricated by growing the AlGaAs layer on the GaAs substrate interposing the GaAs buffer layer therebetween, there are problems such that a device property is degraded due to the increase of a threshold current and a holding current. This is because lattice deffects due to a lattice-mismatching at the interface between the GaAs buffer layer and the AlGaAs layer are induced, and an unclear impurity level is formed at the interface. There are also problems such that an external quantum efficiency is decreased, resulting in the reduction of the amount of emitted light. This is because defects which serve as "carrier killers" are generated in the vicinity of the interface.

As shown in FIG. 2 wherein like elements are indicated by like reference numerals used in FIG. 1, an n-type GaAs layer 28 may be provided on an n-type AlGaAs layer 20 in a conventional light-emitting thyristor. In this manner, GaAs is used as the material of the uppermost layer for the facility of making ohmic contact with an electrode and the simplicity of material. Since the wave length of emitted light is about 780 nm, the light is absorbed during passing through the uppermost layer (GaAs layer) 28 so that the amount of light to be emitted is decreased.

In order to reduce the light absorption by the GaAs layer 28, the thickness of the layer is needed to be thinner. However, if the layer is thinner, additional problems are caused. That is, alloying of electrode material and GaAs by a heat processing is required to from an ohmic electrode, and atoms migrate for a long distance during the heat processing, as a result of which the alloyed area of electrode material is reached to the AlGaAs layer 20 under the GaAs layer 28. This causes the turbulence of crystalline of AlGaAs, resulting in the scattering of light.

FIG. 3 is a graph showing a light absorption spectrum of an n-type GaAs layer at 297K, wherein ordinate designates an absorption coefficient $\alpha$ and abscissa a photon energy. The amount of absorbed light is represented by the following formula.

$$1-e^{-\alpha t} \text{ (t; film thickness)}$$

It is noted from this graph that the absorption coefficient for the light of 780 nm wave length is about $1.5 \times 10^4$. Assuming that the film thickness "t" is 0.02 $\mu$m, it is understood that the amount of emitted light is decreased by 3–4% by calculating the amount of absorbed light based on the above formula. The amount of absorbed light will be further reduced, if the turbulence of atomic arrangement is caused due to the fluctuation of film thickness and the alloying, and the variation of composition.

FIG. 4 shows a light-emitting thyristor in which a GaAs buffer layer 12 is provided on a GaAs substrate 10, and a GaAs layer 28 is used as a topmost layer. In the figure, like element are indicated by like reference numerals used in FIGS. 1 and 2.

In general, a light-emitting thyristor having a pnpn structure is considered to be the combination of a pnp transistor 44 on the substrate side and an npn transistor 46 on the opposite side to the substrate, as shown in FIG. 5. An anode corresponds to an emitter of the pnp transistor 44, a cathode an emitter of the pnp transistor 46, and a gate a base of the pnp transistor 46, respectively. The holding current of the thyristor is determined by the combination of current amplification factors of respective transistors 44 and 46. In order to decrease the holding current, it is required to increase current amplifying factors $\alpha$ of respective transistors. A current amplifying factor $\alpha$ is given by the multiplication of an emitter injection efficiency $\gamma$, a transport efficiency $\beta$, a collector junction avalanche multiplication factor M, and a specific collector efficiency $\alpha^*$. In order to increase an emitter injection efficiency $\gamma$, the impurity concentration of the emitter is designed to be higher that of the base.

The diffusion speed of Zn which is a p-type impurity is very fast, so that Zn is diffused into an n-type semiconductor layer to compensate an n-type impurity. Therefore, if Zn concentration of the anode layer (the GaAs layer 12 and the AlGaAs layer 14) is higher than Si impurity concentration of the n-type gate layer (the AlGaAs layer 16), then most of Si in the vicinity of the interface between the anode layer and the gate layer is compensated to decrease a transport efficiency β of the transistor. Also, non-luminescent center is generated, causing the reduction of the luminous efficiency of the thyristor.

DISCLOSURE OF INVENTION

An object of the present invention is to provide a light-emitting thyristor in which the luminous efficiency thereof is improved, the thyristor being fabricated by growing AlGaAs layers on a GaAs buffer layer formed on a GaAs substrate.

Another object of the present invention is to provide a light-emitting thyristor using GaAs for the material of the uppermost layer, in which the luminous efficiency thereof is improved.

Still another object of the present invention is to provide a light-emitting thyristor including Zn impurity in an n-type gate layer, in which the luminous efficiency thereof is improved.

A further object of the present invention is to provide a self-scanning light-emitting device using such light-emitting thyristors.

An aspect of the present invention is a light-emitting thyristor in which a p-type AlGaAs layer and an n-type AlGaAs layer are alternately stacked to form a pnpn structure on a GaAs buffer layer formed on a GaAs substrate. Al composition of the AlGaAs layer on the GaAs buffer layer is increased in steps or continuously.

According to this light-emitting thyristor, an Al composition of said AlGaAs layer is gradually varied, so that the lattice defects such as dislocation due to lattice-mismatching at the interface between the GaAs buffer layer and the AlGaAs layer may be decreased, and the extreme deformation of an energy band at the interface may be softened.

It is also useful that a single or multi quantum well layer, or a strained superlattice structure is inserted in place of gradual variation of Al composition. In this case, if a quantum well layer or a superlattice layer having a high reflectivity is used, the light toward the substrate is reflected by the quantum well layer or the superlattice layer, thus increasing the amount of emitted light.

When a misfit dislocation is caused in the AlGaAs layer in which Al composition is varied in steps or continuously, a quantum well layer or a strained superlattice structure may be inserted into the AlGaAs layer in order to block the propagation of the misfit dislocation.

According to a second aspect of the present invention, the light absorption by the topmost layer may be decreased by utilizing a material such as InGaP, InGaAsP, or AlGaInP having a absorption edge wave length shorter than 780 nm. It is desirable that this material is lattice matched with the GaAs substrate. As a result, an external quantum efficiency may be increased because the light absorption by the topmost layer is decreased.

According to a third aspect of the present invention, an impurity concentration of at least a part of an anode layer near an n-type gate layer is lower than an impurity concentration of the n-type gate layer in a pnpn structure light-emitting thyristor. Where a p-type first layer, a p-type second layer, an n-type third layer, a p-type fourth layer, an n-type fifth layer, and an n-type sixth layer are epitaxially grown on a p-type substrate, for example, such light-emitting thyristor is composed of the combination of a pnp transistor on the substrate side and an npn transistor on the opposite side to the substrate.

According to the present invention, each impurity concentration of the first and second layer is equal to or smaller than that of the third layer to limit a impurity diffusion from the first and second layer to the third layer. Since an emitter-base junction of a pnp transistor is a hetero junction, even if an impurity concentration of an emitter is lower than that of a base, an emitter injection efficiency is not affected and is held to about 1.

Using light-emitting thyristors described above, a self-scanning light-emitting device of the following structure may be implemented.

A first structure of the self-scanning light-emitting device comprises a plurality of light-emitting elements each having a control electrode for controlling threshold voltage or current for light-emitting operation. The control electrodes of the light-emitting elements are connected to the control electrode of at least one light-emitting element located in the vicinity thereof via an interactive resistor or an electrically unidirectional element, and a plurality of wirings to which voltage or current is applied are connected to electrodes for controlling the light emission of light-emitting elements.

A second structure of the self-scanning light-emitting device comprises a self-scanning transfer element array having such a structure that a plurality of transfer elements each having a control electrode for controlling threshold voltage or current for transfer operation are arranged, the control electrodes of the transfer elements are connected to the control electrode of at least one transfer element located in the vicinity thereof via an interactive resistor or an electrically unidirectional element, power-supply lines are connected to the transfer elements by electrical means, and clock lines are connected to the transfer elements; and a light-emitting element array having such a structure that a plurality of light-emitting elements each having a control electrode for controlling threshold voltage or current are arranged, the control electrodes of the light-emitting element array are connected to the control electrodes of said transfer elements by electrical means, and lines for applying current for light emission of the light-emitting element are provided.

According to the structures described above, an increased luminous efficiency, high-density, compact and low-cost self scanning light-emitting device may be implemented.

BRIEF DESCRIPTION OF DRAWINGS

FIG. 1 is a schematic cross-sectional view of a conventional light-emitting thyristor having a buffer layer.

FIG. 2 is a schematic cross-sectional view of a conventional light-emitting thyristor using a GaAs layer as a topmost layer.

FIG. 3 is a graph showing a light absorption spectrum of an n-type GaAs layer.

FIG. 4 is a schematic cross-sectional view of a conventional light-emitting thyristor.

FIG. 5 is an equivalent circuit diagram of the thyristor shown in FIG. 4.

FIG. 6 is a schematic diagram showing a first embodiment of the present invention.

FIG. 7 is a schematic diagram showing a second embodiment of the present invention.

FIG. 8 is a circuit diagram of a characteristic estimating circuit for a light-emitting thyristor.

FIG. 11 is a schematic diagram showing a third embodiment of the present invention.

FIGS. 12 and 13 are schematic diagrams showing a fourth embodiment of the present invention.

FIG. 16 is a graph showing a light absorption spectrum of $In_{0.5}Ga_{0.5}P$ layer.

FIG. 17 is a circuit diagram of a light output measuring circuit.

FIG. 21 is a schematic diagram showing a seventh embodiment of the present invention.

FIG. 22 is an equivalent circuit diagram of a first fundamental structure of the self-scanning light-emitting device.

FIG. 23 is an equivalent circuit diagram of a second fundamental structure of the self-scanning light-emitting device.

BEST MODE FOR CARRYING OUT THE INVENTION

Figure 9:
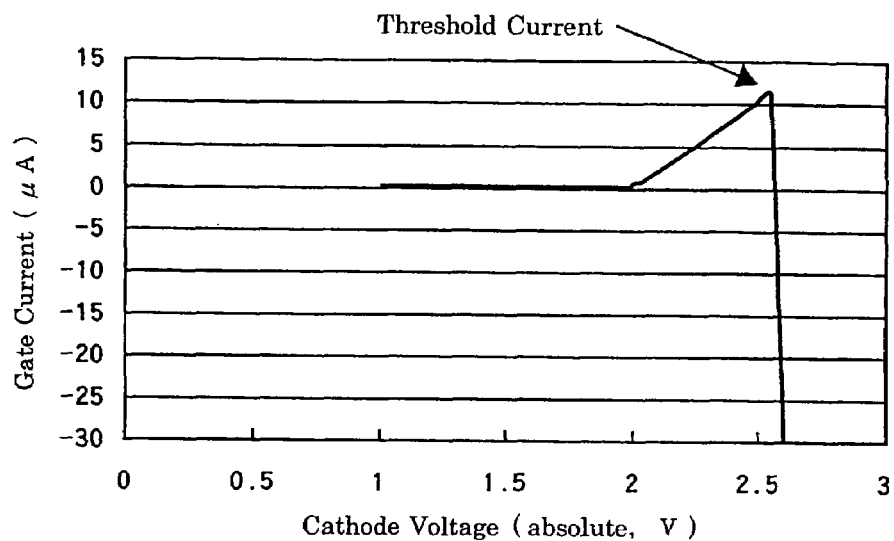
FIG. 9 is a graph showing a measured threshold current.

The embodiments of the present invention will now be described with reference to drawings.

First Embodiment

Referring to FIG. 6, there is shown an embodiment of the present invention wherein the problems in the conventional thyristor shown in FIG. 1 may be resolved. In FIG. 6, $Al_xGa_{1-x}As$ layer is epitaxially grown on a GaAs substrate 10 in such a manner that Al composition x is increased in steps from 0 (GaAs) to 0.35. Since the method of epitaxial growth is identical independent of the types of conductivity (n-type or p-type) of GaAs and AlGaAs, the embodiment will be illustrated without distinguishing the conductivity type.

AlGaAs layer is epitaxially grown on the GaAs buffer layer 12 by varying the supply flow rate of Al in such a manner that Al composition is varied at 0, 0.1, 0.2, 0.3, 0.35, for example. That is, a GaAs layer 12 having Al composition of 0, an AlGaAs layer 50-1 having Al composition of 0.1, an AlGaAs layer 50-2 having Al composition of 0.2, an AlGaAs layer 50-3 having Al composition of 0.3, and an AlGaAs layer 50-4 having Al composition of 0.35 are epitaxially grown successively.

Four AlGaAs layers 50-1, 50-2, 50-3 and 50-4 that Al compositions are increased in steps correspond to the layer 14 in FIG. 1. In this case, the total film thickness from the GaAs buffer layer 12 to AlGaAs layer 50-4 is determined by a containment efficiency of carriers.

The processing steps hereinafter is the same as the conventional steps in FIG. 1. Then, AlGaAs layers having Al composition of 0.35, respectively, are epitaxially grown hereinafter.

Second Embodiment

Referring to FIG. 7, there is shown a second embodiment of the present invention wherein the problems in the conventional thyristor shown in FIG. 1 is also resolved. In FIG. 7, $Al_xGa_{1-x}As$ layer is epitaxially grown on a GaAs buffer layer 12 in such a manner that the composition x of Al is continuously increased from 0 to 0.35. Such modification of Al composition is implemented by varying continuously at least one of supply flow rates of Al and Ga.

In this manner, on the GaAs buffer layer 12 just above the GaAs substrate 10, formed is an AlGaAs layer 52-1 having an Al composition varied from 0 to 0.35, and then an AlGaAs layer 52-2 having an Al composition of 0.35.

These two AlGaAs layers 52-1 and 52-2 are corresponding to the AlGaAs layer 14 in FIG. 1. In this case, the total of film thickness from the GaAs buffer layer 12 to AlGaAs layer 52-2 is determined by a containment efficiency of carriers.

The steps hereinafter is the same as the conventional steps in FIG. 1. Then, AlGaAs layers having Al composition of 0.35, respectively, are epitaxially grown hereinafter.

According to the present embodiments wherein an Al composition is continuously varied, the lattice defects such as dislocation due to lattice-mismatching at the interface between the GaAs buffer layer and the AlGaAs layer may be decreased, and the extreme deformation of an energy band at the interface may be softened. As a result, an adverse effect with respect to the device characteristic is reduced.

Figure 10:
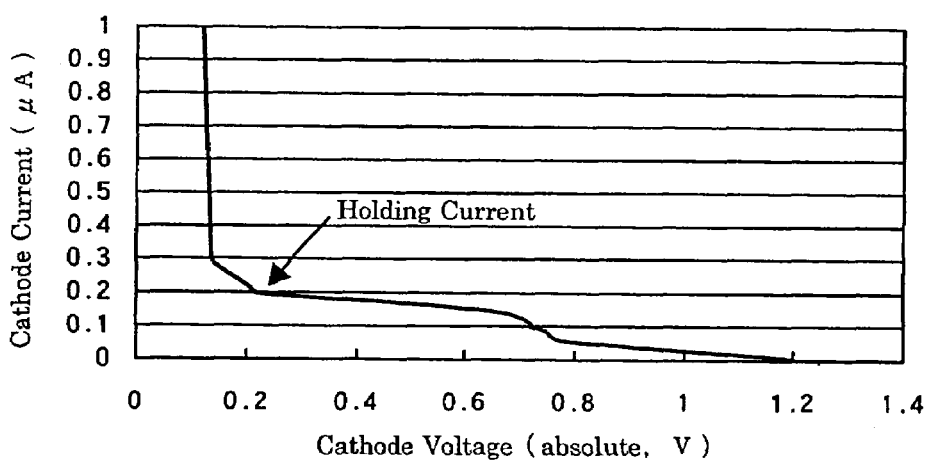
FIG. 10 is a graph showing a measured holding current.

A threshold current, holding current, and light output of the light-emitting thyristors of the first and second embodiments are measured by the following method as illustrated in FIG. 8. An anode electrode 62, a cathode electrode 64, and gate electrode 66 of a light-emitting thyristor 66 are connected to a constant current source 68 and a constant voltage source 70 as shown in FIG. 8. In this characteristic estimating circuit, a cathode voltage $V_k$ and a gate current $I_g$ were measured by varying an output current $I_k$ of the constant current source 68. A typical example of measurements is shown in a graph of FIG. 9. A maximum current just before the gate current $I_g$ was reversed from up to down was considered as a threshold current. A cathode voltage $V_k$ was also measured by varying the output current $I_k$ which is equal to a cathode current of the thyristor 60. A typical $I_k$-$V_k$ characteristic is shown in a graph of FIG. 10. The holding current was defined as a current wherein the cathode voltage was over a constant value (e.g., 0.2V). The light output in the case when the gate electrode was connected to the anode electrode through a resistor and the output current $I_k$ was set to a suitable value (e.g., 13 mA), was measured by a photodiode.

Fifteen-twenty thyristors of the first or second embodiment were measured as to the threshold current, holding current, and light output. Compared with the conventional thyristor shown FIG. 1, the threshold current was decreased by about 20% in average, the holding current was decreased by about 15% in average, and the light output was increased by about 10% in average.

Third Embodiment

Referring to FIG. 11, there is shown a third embodiment of the present invention wherein the problems in the conventional thyristor shown in FIG. 1 is also resolved. In FIG. 11, a quantum well layer 72 is formed on the GaAs buffer layer 12 just above the GaAs substrate 10. On the layer 72, the AlGaAs layer 14, AlGaAs layer 16, . . . are epitaxially grown in the same manner as in FIG. 1. The quantum well layer 72 serves as same as the AlGaAs layer wherein Al composition is increased in steps in the first embodiment or the AlGaAs layer wherein Al composition is continuously increased in the second embodiment. As a result, the lattice defects such as dislocation due to lattice-mismatching at the interface between the GaAS buffer layer and the AlGaAs layer may be decreased, and the extreme deformation of an energy band at the interface may be softened.

Alternatively, a quantum well layer may be inserted into the AlGaAs layer 14 in place of providing the quantum well layer between the GaAs buffer layer 12 and AlGaAs layer 14. Also, a strained superlattice structure may be used in place of the quantum well layer, resulting in the same effect as that in the quantum well layer.

Fourth Embodiment

In the AlGaAs layer wherein Al composition is varied in steps or continuously, there is a problem in that misfit dislocation caused by lattice-mismatching propagates through the AlGaAs layer and reaches the upper layer, thus adversely affecting the characteristic of the thyristor. Embodiments will now be described in which the propagation of such misfit dislocation is reduced or blocked.

In an embodiment shown in FIG. 12, a quantum layer or strained superlattice structure 74 is inserted into the AlGaAs layer 50-4 in FIG. 6. The propagation of the misfit dislocation may be blocked by means of the quantum layer or strained superlattice structure 74.

Figure 13:
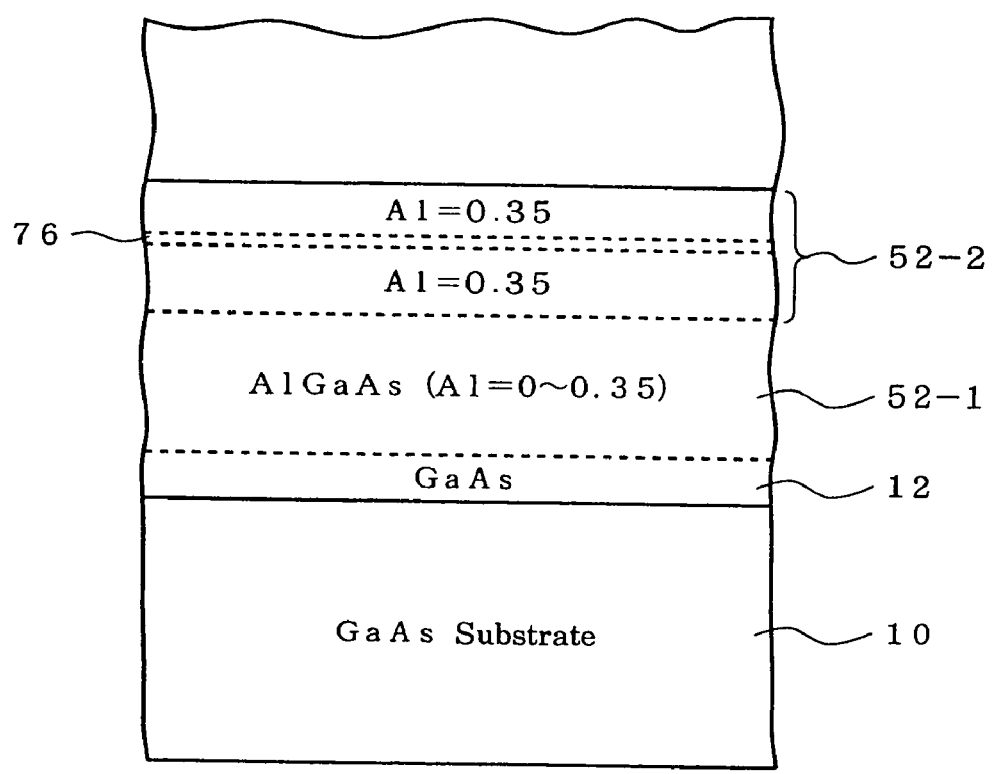

In an embodiment shown in FIG. 13, a quantum layer or strained superlattice structure 76 is inserted into the AlGaAs layer 52-2 in FIG. 7. The propagation of the misfit dislocation may be blocked by means of the quantum layer or strained superlattice structure 76.

Fifth Embodiment

Figure 14:
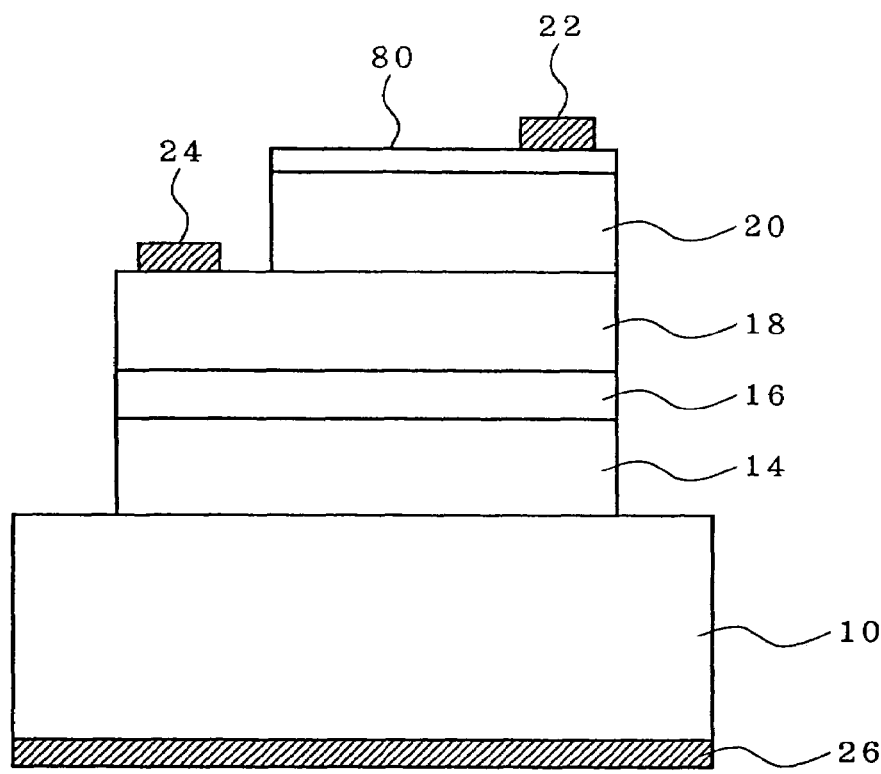
FIG. 14 is a schematic diagram showing a fifth embodiment of the present invention.

FIG. 14 is a schematic cross sectional view of a light-emitting thyristor of the present invention, in which the problems in the conventional thyristor using a GaAs layer for a topmost layer as shown in FIG. 2 is resolved. The structure of the embodiment is substantially the same as that of the conventional thyristor shown in FIG. 2, except that the topmost GaAs layer is replaced by a layer 80 consisting of InGaP which is lattice-matched with the GaAs substrate.

$In_{1-x}Ga_xP$ is lattice-matched with GaAs, when the composition x is about 0.5. When InGaP is grown by means of MOCVD, trimetylindium (TMI) is used for In component, trimetylgallium (TMG) for Ga component, and phosphine for P component. Since the growth conditions of InGaP depend upon the structure of a reactor, the setting of growth conditions is required so as to obtain the desired composition x, i.e., 0.5. A growth temperature is in a range of 600–700° C., when a low pressure growth method is used. Mole ratio (TMG/TMI) of TMG and TMI both of them being material for III Group components is determined, assuming that said mole ratio is proportional to a mixed crystal ratio(x/1-x). Selenium is used as a dopant for obtaining an n-type InGaP, hydrogen selenide being utilized for selenium component.

Figure 15:
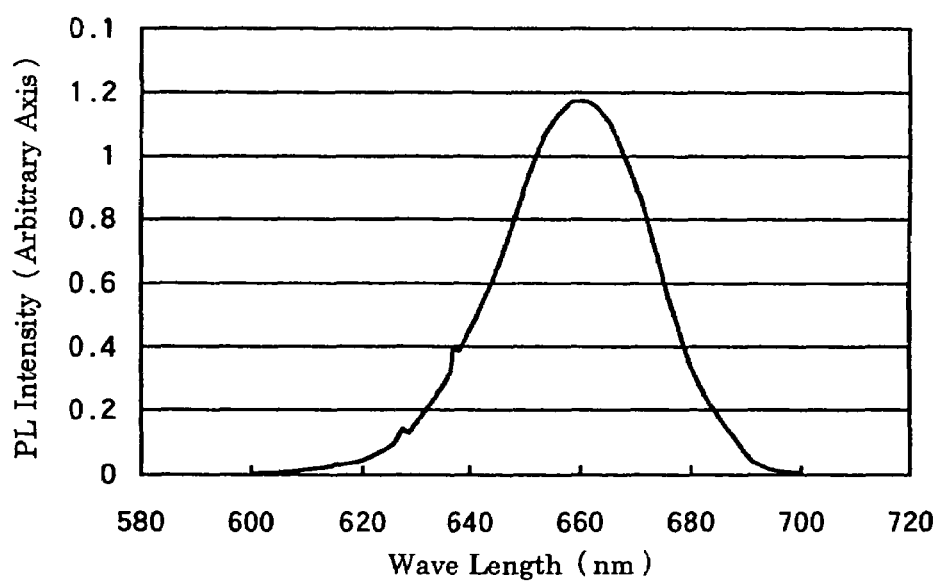
FIG. 15 is a graph showing a photoluminescence intensity of InGaP.

A sample in which a single layer of InGaP was grown on a GaAs substrate was prepared for estimating an optical characteristic. FIG. 15 shows a photoluminescence intensity of $In_{0.5}Ga_{0.5}P$ layer measured at a room temperature. A central wave length of emitted light is about 660 nm. FIG. 16 shows a light absorption spectrum of said $In_{0.5}Ga_{0.5}P$ layer in comparison with that of the GaAs layer shown in FIG. 3. The absorption edge wave length of $In_{0.5}Ga_{0.5}P$ is about 650 nm (0.9 ev) and the absorption coefficient for the light of 780 nm wave length is lower than 10 cm$^{-1}$, which is sufficiently smaller than the absorption coefficient 1.5×10$^4$ cm$^{-1}$ of GaAs.

Said InGaP layer is used as the uppermost cathode layer when a light-emitting thyristor is fabricated. The growth method of the InGaP layer is the same way as described above, and the other processes are substantially the same as that has been disclosed as to the thyristor using a GaAs layer. Also, in order that a cathode electrode makes ohmic contact with the InGaP layer, AuGeNi is used for the material of the cathode electrode.

To measure the light output of the thyristor, a constant current source and resistors are connected to the thyristor as shown in FIG. 17. The gate electrode 84 is connected to the anode electrode 88 through the resistor 86, and the constant current source 92 is connected between the anode electrode 88 and the cathode electrode 90. The light output of the thyristor was measured under the constant cathode current (e.g., 10 mA) by means of a photodiode.

The resulting light output was increased by about 3% in average compared with the typical value of the conventional thyristor. This shows that the light absorption by the $In_{0.5}Ga_{0.5}P$ layer is negligibly small.

Figure 18:
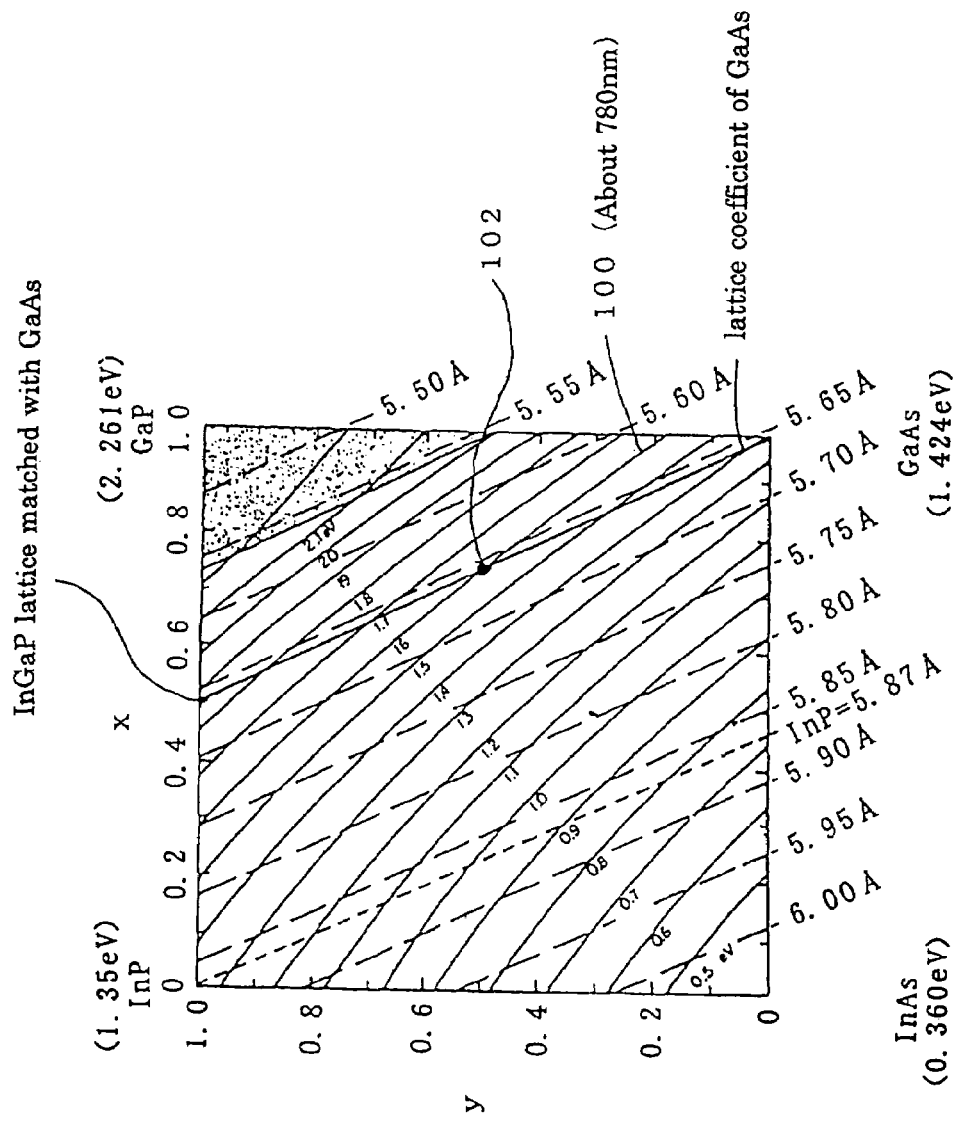
FIG. 18 is a composition diagram of InGaAs.

In the case where $In_{1-x}Ga_xAs_{1-y}P_y$ is used for the material of the uppermost layer, an absorption coefficient may be caused to be small by using the compositions x and y on a large absorption end energy side, respectively. For illustrating this, a composition diagram of $In_{1-x}Ga_xAs_{1-y}P_y$ is shown in FIG. 18. In the figure, a solid line designates a contour of energy gap Eg, and a dotted line a contour of lattice constant. According to this composition diagram, a line 100 designating an absorption energy of 1.6 eV corresponds to a 780 nm wave length of emitted light, and a lattice constant of 5.65 Å corresponds to that of GaAs. Therefore, it is apparent from FIG. 18 that an absorption coefficient may be decreased by using a composition on a high energy side from the dot 102 within compositions having a lattice constant equal to that of GaAs.

Figure 19:
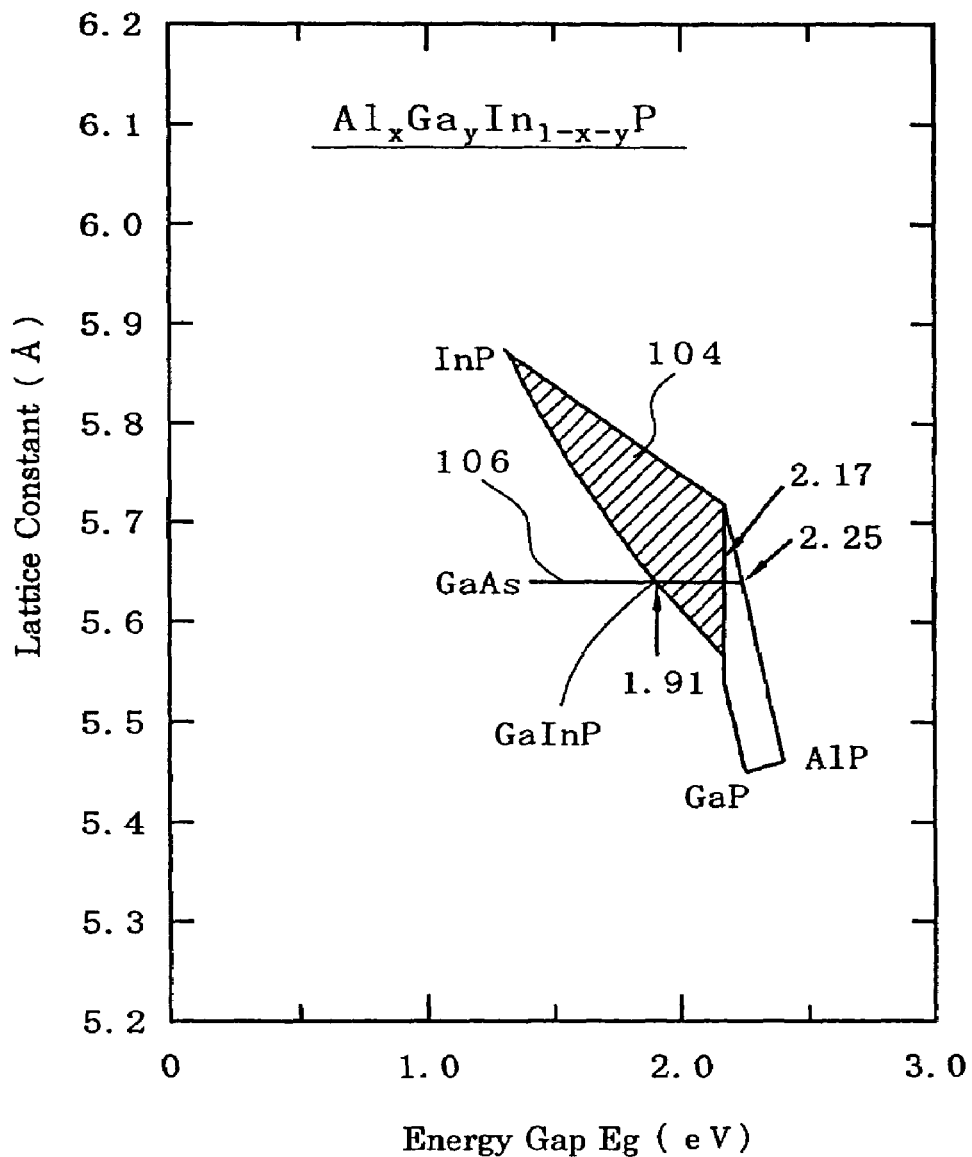
FIG. 19 is a graph illustrating the relationship between a lattice constant and an energy gap of AlGaInP.

In the case where $Al_xGa_yIn_{1-x-y}P$ is used for the material of the uppermost layer, it is required to select each composition x or y so that $Al_xGa_yIn_{1-x-y}P$ is lattice matched with GaAs. FIG. 19 is a graph for illustrating the relationship between a lattice constant and an energy gap of AlGaInP. In the figure, ordinate designates a lattice constant and obscissa an energy gap Eg. A shaded area 104 shows a composition region in which $Al_xGa_yIn_{1-x-y}P$ may be formed, and the composition indicated by a solid line 106 within said composition region is lattice matched with GaAs. In this composition, the energy gap is sufficiently larger with respect to a wave length of 780 nm, then an absorption coefficient is considered to be sufficiently smaller compared with that of GaAs.

Sixth Embodiment

The embodiment of the present invention will now be described, in which the problems caused in the conventional thyristor shown in FIG. 4.

The light-emitting thyristor was fabricated, in which only each concentration of the p-type GaAs layer 12 and the p-type AlGaAs layer 14 in the structure of FIG. 4 was varied. A table 1 shows the kind of material, the film thickness, the type of impurity, and the concentration of impurity of each layer and the substrate.

TABLE 1

| Layer | Material | Thick. (nm) | Impurity | Impurity Concentration (atom/cm³) | | | |
|---|---|---|---|---|---|---|---|
| | | | | No. 1 | No. 2 | No. 3 | No. 4 |
| Layer 28 | GaAs | 30 | Si | $3 \times 10^{18}$ | $3 \times 10^{18}$ | $3 \times 10^{18}$ | $3 \times 10^{18}$ |
| Layer 20 | $Al_{0.3}Ga_{0.7}As$ | 500 | Si | $3 \times 10^{18}$ | $3 \times 10^{18}$ | $3 \times 10^{18}$ | $3 \times 10^{18}$ |
| Layer 18 | $Al_{0.13}Ga_{0.87}As$ | 800 | Zn | $1 \times 10^{17}$ | $1 \times 10^{17}$ | $1 \times 10^{17}$ | $1 \times 10^{17}$ |
| Layer 16 | $Al_{0.13}Ga_{0.87}As$ | 200 | Si | $1 \times 10^{18}$ | $1 \times 10^{18}$ | $1 \times 10^{18}$ | $1 \times 10^{18}$ |
| Layer 14 | $Al_{0.3}Ga_{0.7}As$ | 500 | Zn | $2 \times 10^{17}$ | $2 \times 10^{18}$ | $5 \times 10^{17}$ | $1 \times 10^{18}$ |
| Layer 12 | GaAs | 500 | Zn | $2 \times 10^{17}$ | $2 \times 10^{18}$ | $5 \times 10^{17}$ | $1 \times 10^{18}$ |
| Substrate 10 | GaAs | | Zn | | | | |

The substrate 10 is composed of GaAs, and the impurity therein is Zn. The buffer layer 12 is composed of GaAs with 500 nm thickness, and the impurity therein is Zn. The anode layer 14 is composed of $Al_{0.3}Ga_{0.7}As$ with 500 nm thickness, and the impurity therein is Zn. The n-type gate layer 16 is composed of $Al_{0.13}Ga_{0.87}As$ with 200 nm, and the impurity therein is Si. The p-type gate layer 18 is composed of $Al_{0.13}Ga_{0.87}As$ with 800 nm thickness, and the impurity therein is Zn. The cathode layer 20 is composed of $Al_{0.3}Ga_{0.7}As$ with 500 nm thickness, and the impurity therein is Si. The ohmic contact layer 28 is composed of GaAs with 30 nm thickness, and the impurity therein is Si.

Four types of impurity concentration, i.e., Nos. 1–4 were prepared as shown in Table 1. Nos. 1–4 impurity concentration in each of the four layers 16, 18, 20, 28 are the same. That is, Si impurity concentration of the layer 16 is $1 \times 10^{18}/cm^3$, Zn impurity concentration of the layer 18 is $1 \times 10^{17}/cm^3$, Si impurity concentration of the layer 20 is $3 \times 10^{18}/cm^3$, and Si impurity concentration of the layer 28 is $3 \times 10^{18}/cm^3$.

On the other hand, each Zn impurity concentration of the layers 12 and 14 in No. 1 is $2 \times 10^{17}/cm^3$, each Zn impurity concentration of the layers 12 and 14 in No. 2 is $2 \times 10^{18}/cm^3$, each Zn impurity concentration of the layers 12 and 14 in No. 3 is $5 \times 10^{17}/cm^3$, and each Zn impurity concentration of the layers 12 and 14 in No. 4 is $1 \times 10^{18}/cm^3$.

Apparent from the above, each impurity concentration of the layers 12 and 14 is not lower than that Si impurity concentration of the layer 16 in Nos. 2 and 4.

Figure 20:
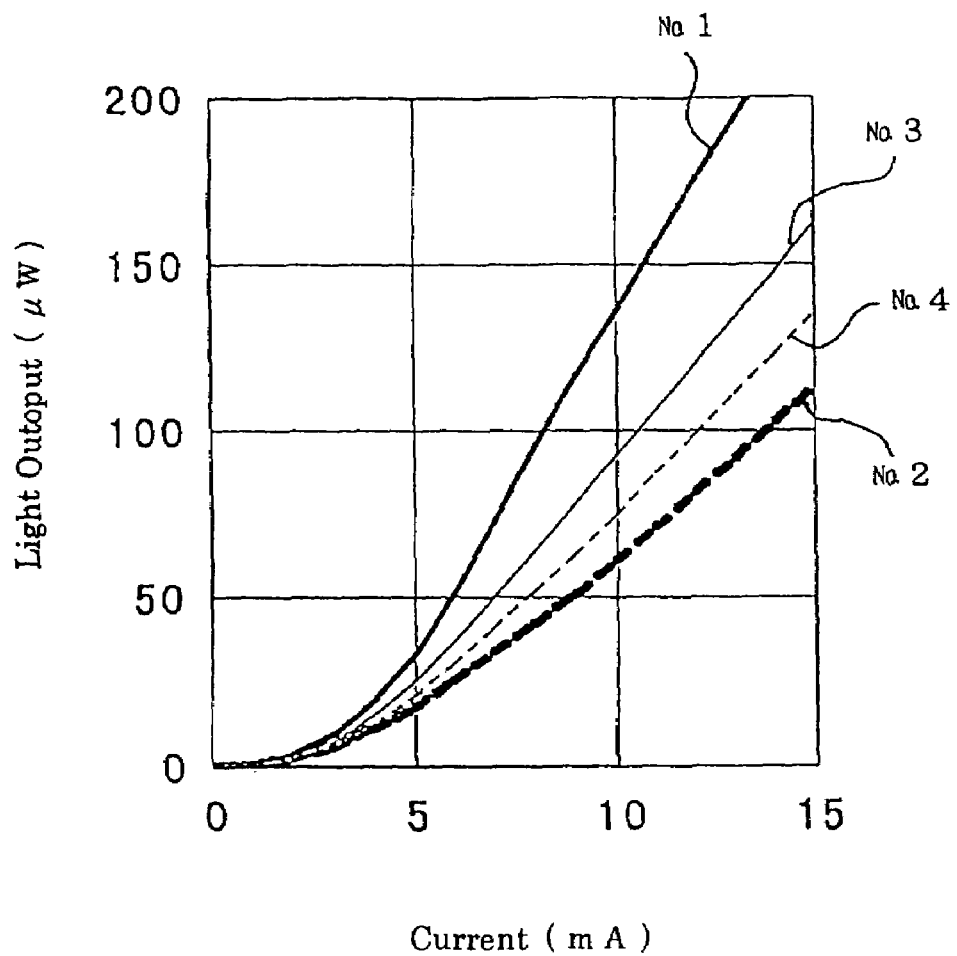
FIG. 20 is a graph showing current-light output characteristics.

For the light-emitting thyristors each having impurity concentration of Nos. 1–4, the current-light output characteristics were measured, respectively. The resulting current-light output characteristics are shown in FIG. 20. The light-emitting thyristor of No. 1 wherein each Zn concentration of the layers 12 and 14 is sufficiently lower than Si concentration of the layer 16 has the highest amount of emitted light. The thyristor of No. 3 has the next higher amount of emitted light. On the other hand, the thyristors of No. 4 and No. 2 wherein each Zn concentration of the layers 12 and 14 is equal to or lower than Si concentration of the layer 16 have the lower amount of emitted light. Therefore, it is noted that the luminous efficiency of the thyristor is not decreased, in which each Zn concentration of the layers 12 and 14 is set so as to be lower than Si concentration of the layer 16. This is because the impurity diffusion from the layers 12 and 14 to the layer 16 is limited.

Seventh Embodiment

In the sixth embodiment described above, it is made apparent that the advantageous effect may be obtained by lowering each impurity concentration of the layers 12 and 14 than that of the layer 16. However, the lowering of each impurity concentration of the layers 12 and 14 increases each resistance of these layers, having an effect on the characteristic of the thyristor. In order to avoid this, the layer 14 in the sixth embodiment is divided into two layers 14-1 and 14-2 as shown in FIG. 21. In this thyristor, the impurity concentration of each layer is set as shown in Table 2. The impurity concentration of the upper layer 14-2 of two divided layers is set to lower concentration, i.e., $2 \times 10^{16}/cm^3$, and that of the lower layer 14-1 is set to $2 \times 10^{18}/cm^3$. Each impurity concentration of another layers is the same as in the sixth embodiment.

An impurity concentration of each layer after growing was measured by a secondary ion mass spectroscopy, the result (measured concentration) of which is also shown in Table 2. According to the measuring result, it is noted that the impurity concentration of the upper layer 14-2 was $4 \times 10^{17}/cm^3$ larger than the set concentration ($2 \times 10^{16}/cm^3$). This is because Zn was diffused from the lower layer 14-1 to the upper layer 14-2 during growing the upper layer.

The current-light output characteristic of the thyristor according to this embodiment was similar to that of No. 1 case of the sixth embodiment. Therefore, it is noted that there is an effect when the impurity concentration of the part of the layer 14 near the layer 16 is low.

TABLE 2

| Layer | Material | Thick. (nm) | Impurity | Impurity Concentration (atom/cm³) | |
|---|---|---|---|---|---|
| | | | | Set | Measured |
| Layer 28 | GaAs | 30 | Si | $3 \times 10^{18}$ | $3 \times 10^{18}$ |
| Layer 20 | $Al_{0.3}Ga_{0.7}As$ | 500 | Si | $3 \times 10^{18}$ | $3 \times 10^{18}$ |
| Layer 18 | $Al_{0.13}Ga_{0.87}As$ | 800 | Zn | $1 \times 10^{17}$ | $1 \times 10^{17}$ |
| Layer 16 | $Al_{0.13}Ga_{0.87}As$ | 200 | Si | $3 \times 10^{18}$ | $3 \times 10^{18}$ |
| Layer 14-2 | $Al_{0.3}Ga_{0.7}As$ | 100 | Zn | $2 \times 10^{16}$ | $4 \times 10^{17}$ |
| Layer 14-1 | $Al_{0.3}Ga_{0.7}As$ | 400 | Zn | $2 \times 10^{18}$ | $2 \times 10^{18}$ |
| Layer 12 | GaAs | 500 | Zn | $2 \times 10^{18}$ | $2 \times 10^{18}$ |
| Substrate 10 | GaAs | | | | |

While a p-type substrate is used in the sixth and seventh embodiments, an n-type substrate may be used. In this case, the impurity concentration of the anode layer may be lower than that of an n-type gate layer. Also, while the embodiments are illustrated for an impurity Zn which may be easily diffused, the present invention may be applicable to another kind of impurities for the fifth and sixth layers.

Eighth Embodiment

Three fundamental structures of self-scanning light-emitting device to which the light-emitting thyristor of the present invention can be applied will now be described.

FIG. 22 shows an equivalent circuit diagram of a first fundamental structure of the self-scanning light-emitting device. According to the structure, light-emitting thyristors . . . $T_{-2}$, $T_{-1}$, $T_0$, $T_{+1}$, $T_{+2}$ . . . are used as light-emitting elements, each of thyristors comprising gate electrodes . . . $G_{-2}$, $G_{-1}$, $G_0$, $G_{+1}$, $G_{+2}$ . . . , respectively. Supply voltage $V_{GK}$ is applied to all of the gate electrodes via a load resistor $R_L$, respectively. The neighboring gate electrodes are electrically connected to each other via a resistor $R_I$ to obtain interaction. Each of three transfer clock ($\phi_1$, $\phi_2$, $\phi_3$) lines is connected to the anode electrode of each light-emitting element at intervals of three elements (in a repeated manner).

The operation of this self-scanning light-emitting device will now be described. Assume that the transfer clock $\phi_3$ is at a high level, and the light-emitting thyristor $T_0$ is turned on. At this time, the voltage of the gate electrode $G_0$ is lowered to a level near zero volts due to the characteristic of the light-emitting thyristor. Assuming that the supply voltage $V_{GK}$ is 5 volts, the gate voltage of each light-emitting thyristor is determined by the resistor network consisting of the load resistors $R_L$ and the interactive resistors $R_I$. The gate voltage of a thyristor near the light-emitting thyristor $T_0$ is lowered most, and the gate voltage V(G) of each subsequent thyristor rises as it is remote from the thyristor $T_0$. This can be expressed as follows:

$$V(G_0) < V(G_{+1}) = V(G_{-1}) < V(G_{+2}) = V(G_{-2}) \quad (1)$$

The difference among these voltages can be set by properly selecting the values of the load resistor $R_L$ and the interactive resistor $R_I$.

It is known that the turn-on voltage $V_{ON}$ of the light-emitting thyristor is a voltage that is higher than the gate voltage V(G) by the diffusion potential $V_{dif}$ of pn junction as shown in the following formula.

$$V_{ON} \approx V(G) + V_{dif} \quad (2)$$

Consequently, by setting the voltage applied to the anode to a level higher than this turn-on voltage $V_{ON}$, the light-emitting thyristor may be turned on.

In the state where the light-emitting thyristor $T_0$ is turned on, the next transfer clock $\phi_1$ is raised to a high level. Although this transfer clock $\phi_1$ is applied to the light-emitting thyristors $T_{+1}$ and $T_{-2}$ simultaneously, only the light-emitting thyristor $T_{+1}$ can be turned on by setting the high-level voltage $V_H$ of the transfer clock $\phi_1$ to the following range.

$$V(G_{-2}) + V_{dif} > V_H > V(G_{+1}) + V_{dif} \quad (3)$$

By doing this, the light-emitting thyristors $T_0$ and $T_{+1}$ are turned on simultaneously. When the transfer clock $\phi_3$ is lowered to a low level, the light-emitting thyristors $T_0$ is turned off, and this completes transferring ON state from the thyristor $T_0$ to the thyristor $T_{+1}$.

Based on the principle described above, the ON state of the light-emitting thyristor is sequentially transferred by setting the high-level voltage of the transfer clocks $\phi_1$, $\phi_2$, and $\phi_3$ in such a manner as to overlap sequentially and slightly with each other. In this way, the self-scanning light-emitting device according to the present invention is accomplished.

FIG. 23 shows an equivalent circuit diagram of a second fundamental structure of the self-scanning light-emitting device. This self-scanning light-emitting device uses a diode as means for electrically connecting the gate electrodes of light-emitting thyristors to each other. That is, the diodes . . . $D_{-2}$, $D_{-1}$, $D_0$, $D_{+1}$ . . . are used in place of the interactive resistors $R_I$ in FIG. 22. The number of transfer clock lines may be only two due to the unidirectional of diode characteristics, then each of two clock ($\phi_1$, $\phi_2$) lines is connected to the anode electrode of each light-emitting element at intervals of two elements.

The operation of this self-scanning light-emitting device will now be described. Assuming that as the transfer clock $\phi_2$ is raised to a high level, the light-emitting thyristor $T_0$ is turned on. At this time, the voltage of the gate electrode $G_0$ is reduced to a level near zero volts due to the characteristic of the thyristor. Assuming that the supply voltage $V_{GK}$ is 5 volts, the gate voltage of each light-emitting thyristor is determined by the network consisting of the load resistors $R_L$ and the diodes D. The gate voltage of an thyristor nearest to the light-emitting thyristor $T_0$ drops most, and the gate voltages of those thyristors rise as they are further away from the light-emitting thyristor $T_0$.

The voltage reducing effect works only in the rightward direction from the light-emitting thyristor $T_0$ due to the unidirectionality and asymmetry of diode characteristics. That is, the gate electrode $G_{+1}$ is set at a higher voltage with respect to the gate electrode $G_0$ by a forward rise voltage $V_{dif}$ of the diode, while the gate electrode $G_{+2}$ is set at a higher voltage with respect to the gate electrode $G_{+1}$ by a forward rise voltage $V_{dif}$ of the diode. On the other hand, current does not flow in the diode $D_{-1}$ on the left side of the light-emitting thyristor $T_0$ because the diode $D_{-1}$ is reverse-viased. As a result, the gate electrode $G_{-1}$ is at the same potential as the supply voltage $V_{GK}$.

Although the next transfer clock $\phi_1$ is applied to the nearest light-emitting thyristor $T_{+1}$, $T_{-1}$; $T_{+3}$, $T_{-3}$; and so on, the thyristor having the lowest turn-on voltage among them is $T_{+1}$, whose turn-on voltage is approximately the gate voltage of $G_{+1} + V_{dif}$, about twice as high as $V_{dif}$. The thyristor having the second lowest turn-on voltage is $T_{+3}$, about four times as high as $V_{dif}$. The turn-on voltage of the thyristors $T_{-1}$ and $T_{-3}$ is about $V_{GK} + V_{dif}$.

It follows from the above discussion that by setting the high-level voltage of the transfer clock $\phi_1$ to a level about twice to four times as high as $V_{dif}$, only the light-emitting thyristor $T_{+1}$ can be turned-on to perform a transfer operation.

Figure 24:
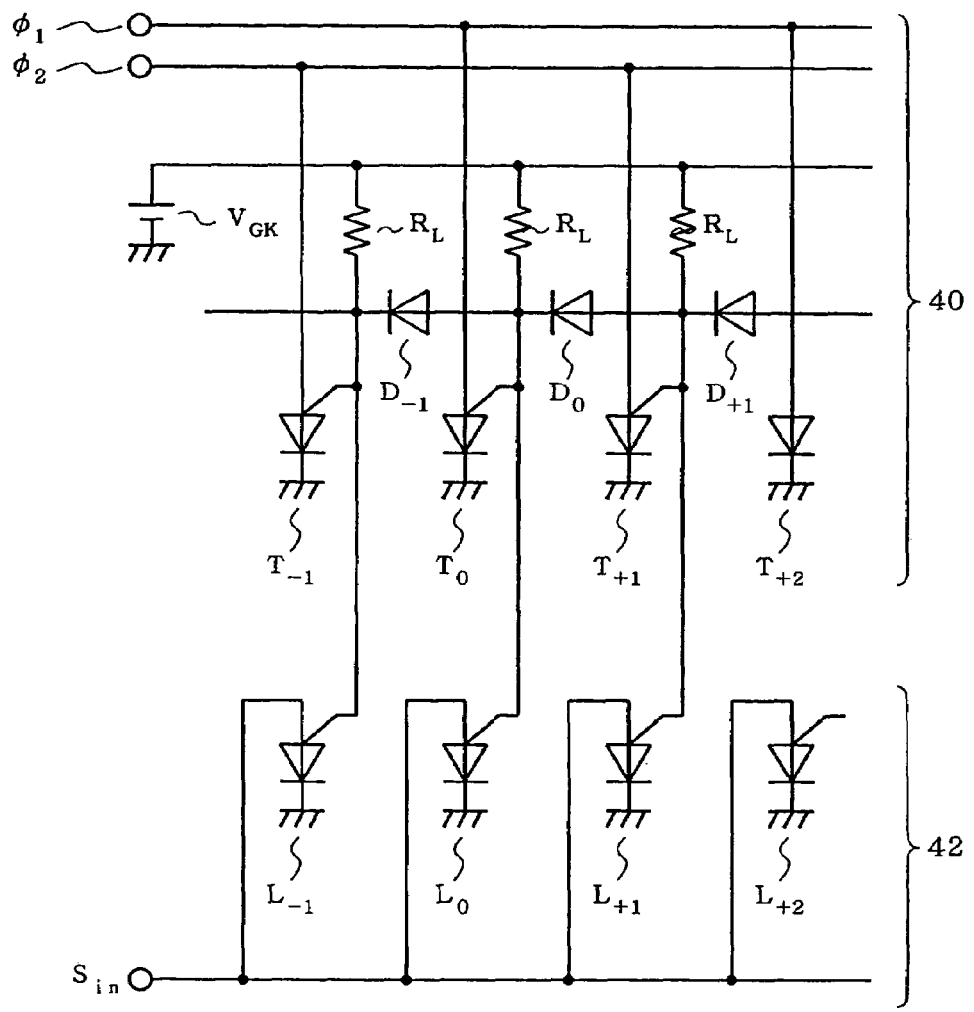
FIG. 24 is an equivalent circuit diagram of a third fundamental structure of the self-scanning light-emitting device.

FIG. 24 shows an equivalent circuit diagram of a third fundamental structure of the self-scanning light-emitting device. According to the structure, a transfer portion 40 and a light-emitting portion 42 are separated. The circuit structure of the transfer portion 40 is the same as that shown in FIG. 23, and the light-emitting thyristors . . . $T_{-1}$, $T_0$, $T_{+1}$, $T_{+2}$ . . . are used as transfer elements in this embodiment.

The light-emitting portion 42 comprises writable light-emitting elements $L_{-1}$, $L_0$, $L_{+1}$, $L_{+2}$ . . . , each gate thereof is connected to the gate . . . $G_{-1}$, $G_0$, $G_{+1}$ . . . of the transfer elements . . . $T_{-1}$, $T_0$, $T_{+1}$, $T_{+2}$, respectively. A write signal $S_{in}$ is applied to all of the anode of the writable light-emitting elements.

In the following, the operation of this self-scanning light-emitting device will be described. Assuming that the transfer element $T_0$ is in the ON state, the voltage of the gate electrode $G_0$ lowers below the supply voltage $V_{GK}$ and to almost zero volts. Consequently, if the voltage of the write signal $S_{in}$ is higher than the diffusion potential (about 1 volt)

of the pn junction, the light-emitting element $L_0$ can be turned into a light-emission state.

On the other hand, the voltage of the gate electrode $G_{-1}$ is about 5 volts, and the voltage of the gate electrode $G_{+1}$ is about 1 volt. Consequently, the write voltage of the light-emitting element $L_{-1}$ is about 6 volts, and the write voltage of the light-emitting element $L_{+1}$ is about 2 volts. It follows from this that the voltage of the write signal $S_{in}$ which can write only in the light-emitting element $L_0$ is a range of about 1–2 volts. When the light-emitting element $L_0$ is turned on, that is, in the light-emitting state, the voltage of the write signal $S_{in}$ is fixed to about 1 volt. Thus, an error of selecting other light-emitting elements can be prevented.

Light emission intensity is determined by the amount of current fed to the write signal $S_{in}$, an image can be written at any desired intensity. In order to transfer the light-emitting state to the next element, it is necessary to first turn off the element that is emitting light by temporarily reducing the voltage of the write signal $S_{in}$ down to zero volts.

INDUSTRIAL APPLICABILITY

According to the present invention, a light-emitting thyristor having an improved luminous efficiency may be provided, and furthermore a self-scanning light-emitting device composed of an array of light-emitting thyristors of the present invention and having a self-scanning function may be provided.

The invention claimed is:

1. A light-emitting thyristor, comprising:
a p-type anode layer including Zn as an impurity;
an n-type gate layer formed adjacent to the p-type anode layer;
a p-type layer formed adjacent to the n-type gate layer; and
an n-type cathode layer formed adjacent to the p-type gate layer;
wherein an impurity concentration of at least the part of the anode layer near the n-type gate layer is lower than an impurity concentration of the n-type gate layer.

2. The light-emitting thyristor of claim 1, wherein the impurity of the n-type gate is Si.

3. A self-scanning light-emitting device, comprising:
a structure in which a plurality of light-emitting elements each having a control electrode for controlling threshold voltage or current for light-emitting operation are arranged, the control electrodes of the light-emitting elements are connected to the control electrodes of the light-emitting elements are connected to the control electrode of at least one light-emitting element located in the vicinity thereof via an interactive resistor, and a plurality of wirings to which voltage or current is applied are connected to electrodes for controlling the light emission of the light-emitting elements,
wherein the light-emitting element is a light-emitting thyristor as set forth in any one of claims 1 or 2.

4. A self-scanning light-emitting device, comprising:
a structure in which a plurality of light-emitting elements each having a control electrode for controlling threshold voltage or current for light-emitting operation are arranged, the control electrodes for the light-emitting elements are connected to the control electrode of at least one light-emitting element located in the vicinity thereof via an electrically unidirectional element, and a plurality of wiring to which voltage or current is applied are connected to electrodes for controlling the light-emission of light-emitting elements,
wherein the light-emitting element is a light-emitting thyristor as set forth in any one of claims 1 or 2.

5. The self-scanning light-emitting device of claim 4, wherein the electrically unidirectional element is a diode.

6. A self-scanning light-emitting device, comprising:
a self-scanning transfer element array having such a structure that a plurality of transfer elements each having a control electrode for controlling threshold voltage or current for transfer operation are arranged, the control electrodes of the transfer elements are connected to the control electrode of at least one transfer element located in the vicinity thereof via an interactive resistor, power-supply lines are connected to the transfer elements by electrical means, and clock lines are connected to the transfer elements, and
a light-emitting element array having such a structure that a plurality of light-emitting elements each having a control electrode for controlling threshold voltage or current are arranged, the control electrodes of the light-emitting element array are connected to the control electrodes of said transfer elements by electrical means, and lines for applying current for light emission of the light-emitting element are provided,
wherein the light-emitting element is a light-emitting thyristor as set forth in any one of claims 1 or 2.

7. A self-scanning light-emitting device, comprising:
a self-scanning transfer element array having such a structure that a plurality of transfer elements each having a control electrode for controlling threshold voltage or current for transfer operation are arranged, the control electrodes of the transfer elements are connected to the control electrode of at least one transfer element located in the vicinity thereof via an electrically unidirectional element, power-supply lines are connected to the transfer elements by electrical means, and clock lines are connected to the transfer elements, and
a light-emitting element array having such a structure that a plurality of light-emitting elements each having a control electrode for controlling threshold voltage or current are arranged, the control electrodes of the light-emitting element array are connected to the control electrodes of said transfer elements by electrical means, and line for applying current for light emission of the light-emitting element are provided,
wherein the light-emitting element is a light-emitting thyristor as set forth in any one of claims 1 or 2.

8. The self-scanning light-emitting device of claim 7, wherein the electrically unidirectional element is a diode.

* * * * *